(12) United States Patent
Takebayashi et al.

(10) Patent No.: US 10,483,146 B2
(45) Date of Patent: Nov. 19, 2019

(54) ELECTROSTATIC CHUCK HEATER

(71) Applicant: NGK INSULATORS, LTD., Nagoya (JP)

(72) Inventors: Hiroshi Takebayashi, Handa (JP); Natsuki Hirata, Nagoya (JP); Shinya Hasegawa, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/910,344

(22) Filed: Mar. 2, 2018

(65) Prior Publication Data

US 2018/0190529 A1 Jul. 5, 2018

Related U.S. Application Data

(63) Continuation of application No. PCT/JP2017/025267, filed on Jul. 11, 2017.

(30) Foreign Application Priority Data

Jul. 19, 2016 (JP) ................. 2016-141329

(51) Int. Cl.
*H01L 21/683* (2006.01)
*H01L 21/67* (2006.01)
(Continued)

(52) U.S. Cl.
CPC .... *H01L 21/6833* (2013.01); *H01J 37/32724* (2013.01); *H01L 21/67103* (2013.01);
(Continued)

(58) Field of Classification Search
CPC ........... H01L 21/6833; H01L 37/32724; H01L 21/67103; H01L 21/6831; H01J 37/32724; H05B 3/03; H05B 3/20; H05B 3/28
(Continued)

(56) References Cited

U.S. PATENT DOCUMENTS

2005/0173410 A1  8/2005  Okajima et al.
2005/0173413 A1  8/2005  Goto
(Continued)

FOREIGN PATENT DOCUMENTS

JP   H08-125001 A1   5/1996
JP   2005-166354 A1  6/2005
(Continued)

OTHER PUBLICATIONS

English translation of International Preliminary Report on Patentability (Chapter I) (Application No. PCT/JP2017/025267) dated Jan. 31, 2019, 8 pages.
International Search Report and Written Opinion (Application No. PCT/JP2017/025267) dated Aug. 15, 2017.
Japanese Office Action (Application No. 2017-564145) dated Jul. 17, 2018 (with English translation).

*Primary Examiner* — Zeev V Kitov
(74) *Attorney, Agent, or Firm* — Burr & Brown, PLLC

(57) ABSTRACT

An electrostatic chuck heater includes an electrostatic chuck in which an electrostatic electrode is embedded in a ceramic sintered body; a small-zone formation region including a plurality of small zones in which small heater electrodes are wired; a power source to which the plurality of small heater electrodes are connected in parallel; and a small-zone control apparatus that performs control such that desired electric power is supplied to each of the small heater electrodes, wherein among the plurality of small heater electrodes, a small heater electrode that is wired in a small zone including a cool spot has a resistance that is set to a smaller value than that of the other small heater electrodes.

5 Claims, 4 Drawing Sheets

(51) Int. Cl.
  *H01J 37/32* (2006.01)
  *H05B 3/03* (2006.01)
  *H05B 3/28* (2006.01)
(52) U.S. Cl.
  CPC .... *H01L 21/67109* (2013.01); *H01L 21/6831* (2013.01); *H05B 3/03* (2013.01); *H05B 3/283* (2013.01); *H05B 2203/003* (2013.01)
(58) Field of Classification Search
  USPC .......................................................... 361/234
  See application file for complete search history.

(56) References Cited

U.S. PATENT DOCUMENTS

2013/0001213 A1\* 1/2013 Lee ................... H01L 21/67103
   219/385
2016/0225645 A1\* 8/2016 Koizumi ........... H01L 21/67248

FOREIGN PATENT DOCUMENTS

| JP | 2005-197161 A1 | 7/2005 |
| JP | 2007-088484 A1 | 4/2007 |
| JP | 2016-100473 A1 | 5/2016 |
| WO | 2016/080502 A1 | 5/2016 |

\* cited by examiner

ELECTROSTATIC CHUCK HEATER

BACKGROUND OF THE INVENTION

1. Field of the Invention

The present invention relates to an electrostatic chuck heater.

2. Description of the Related Art

In semiconductor manufacturing apparatuses, ceramic heaters for heating wafers are employed. As such a ceramic heater, a so-called multi-zone heater is known. In this heater, an inner circumferential heater and an outer circumferential heater that are made of a high-melting point metal are embedded respectively in an internal zone and an external zone in a ceramic base, and electric power is supplied independently to each of the heaters, and thereby heat generation of each of the heaters is independently controlled (see, for example, PTL 1).

CITATION LIST

Patent Literature

PTL 1: JP 2007-88484 A

SUMMARY OF THE INVENTION

In order to independently control the heat generation of each of the heaters in such a multi-zone heater, it is conceivable to individually control the electric power of each of the heaters. In this case, by increasing the heat generation amount of a heater in a zone including a cool spot compared with a heater in the other zones, the temperature needs to be made generally equal. However, there is an upper limit of applicable electric power under the restriction of the resistance of the heaters and a power source capacity, and accordingly, it is not possible to apply, to the heater in a zone including a cool spot, electric power that is over the upper limit of the applicable electric power. Therefore, in some cases, the heat generation amount of the heater in a zone including a cool spot has been insufficient, and the temperature has not been sufficiently equal.

The present invention has been made in order to solve the above problem, and a main purpose thereof is to make the temperature sufficiently equal in an electrostatic chuck heater of a multi-zone heater type.

An electrostatic chuck heater according to the present invention comprises an electrostatic chuck in which an electrostatic electrode is embedded in a ceramic sintered body; a small-zone formation region provided inside the ceramic sintered body or a heater support body that is integrated with the ceramic sintered body, the small-zone formation region including a plurality of small zones in which small heater electrodes are wired; a power source to which the plurality of small heater electrodes are connected in parallel; and a small-zone control apparatus that performs control such that desired electric power is supplied to each of the small heater electrodes by using an output ratio to a suppliable output corresponding to each of the small heater electrodes, wherein among the plurality of small heater electrodes, a small heater electrode that is wired in a small zone including a cool spot has a resistance that is set to a smaller value than that of the other small heater electrodes.

In this electrostatic chuck heater, the small-zone formation region is provided inside the ceramic sintered body in which the electrostatic electrode is embedded or the heater support body that is integrated with the ceramic sintered body. The small-zone formation region includes the plurality of small zones in which the small heater electrodes are wired. In addition, the plurality of small heater electrodes are connected in parallel to the power source. Electric power supplied to each of the small heater electrodes is supplied from the power source by using the output ratio to the suppliable output corresponding to each of the small heater electrodes. Such an output ratio may be, for example, if a power source with a constant voltage is connected to the heater via a switch, a ratio $\tau/T$ (duty ratio) of a period $\tau$ during which the switch is turned on to a period T. Here, the resistance of the small heater electrode wired in the small zone including a cool spot is set to a smaller value than that of the other small heater electrodes. Since the plurality of small heater electrodes are connected in parallel to the power source, the amount of heat that can be generated by each of the small heater electrodes is increased as the resistance is decreased. Although it is not possible to supply electric power that is over the upper limit of the output ratio to the small heater electrode in the small zone including a cool spot, since the resistance is lower than that of the small heater electrodes in the other zones, the heat generation amount is increased even if the output ratio is the same. Accordingly, it is possible to ensure a margin for electric power that is applicable to each small heater in a state in which the temperature of the zone including a cool spot is the same or substantially the same as the temperature of the zones not including a cool spot. Thus, it is possible to make the temperature sufficiently equal in the electrostatic chuck heater of a multi-zone heater type against variable temperatures due to various disturbances.

In the electrostatic chuck heater of the present invention, the small heater electrode that is wired in the small zone including the cool spot may have a larger width than the other small heater electrodes or may be formed of a material having a lower resistivity than that of the other small heater electrodes. Even if the electrode material is the same, a large width decreases the resistance. In addition, even if the width is the same, the use of a material having a low resistivity decreases the resistance. Thus, in this manner, the present invention can be easily implemented.

In the electrostatic chuck heater of the present invention, the small zone including the cool spot may be a small zone in which a through hole or a hole having a bottom in a vertical direction is provided. The through hole or the hole having a bottom in the vertical direction is a portion in which wiring cannot be provided in the small heater electrode and thus tends to be a cool spot. Examples of the through hole in the vertical direction include an insertion hole of a lift-pin that lifts up a wafer, a gas supplying hole for sending a He gas to a rear surface of the wafer, and the like. In addition, examples of the hole having a bottom in the vertical direction include a hole for inserting a feed rod for supplying electric power to the electrostatic electrode or the heater electrode, a hole for inserting a temperature sensor from a rear surface of the electrostatic chuck heater toward the vicinity of a wafer placing surface, and the like.

The electrostatic chuck heater of the present invention may further include a large-zone formation region provided inside the ceramic sintered body or the heater support body, the large-zone formation region including large zones, whose number is smaller than the number of the small zones, in which large-zone electrodes are wired, and a large-zone control apparatus that controls electric power supply to each of the large-zone electrodes. In this manner, in principle, the temperature of the wafer placed on the electrostatic chuck is made equal by controlling the large-zone electrodes, and the temperature of the wafer is made more equal by controlling the small-zone electrodes. Thus, the temperature can be made equal delicately.

DETAILED DESCRIPTION OF THE INVENTION

Figure 1:
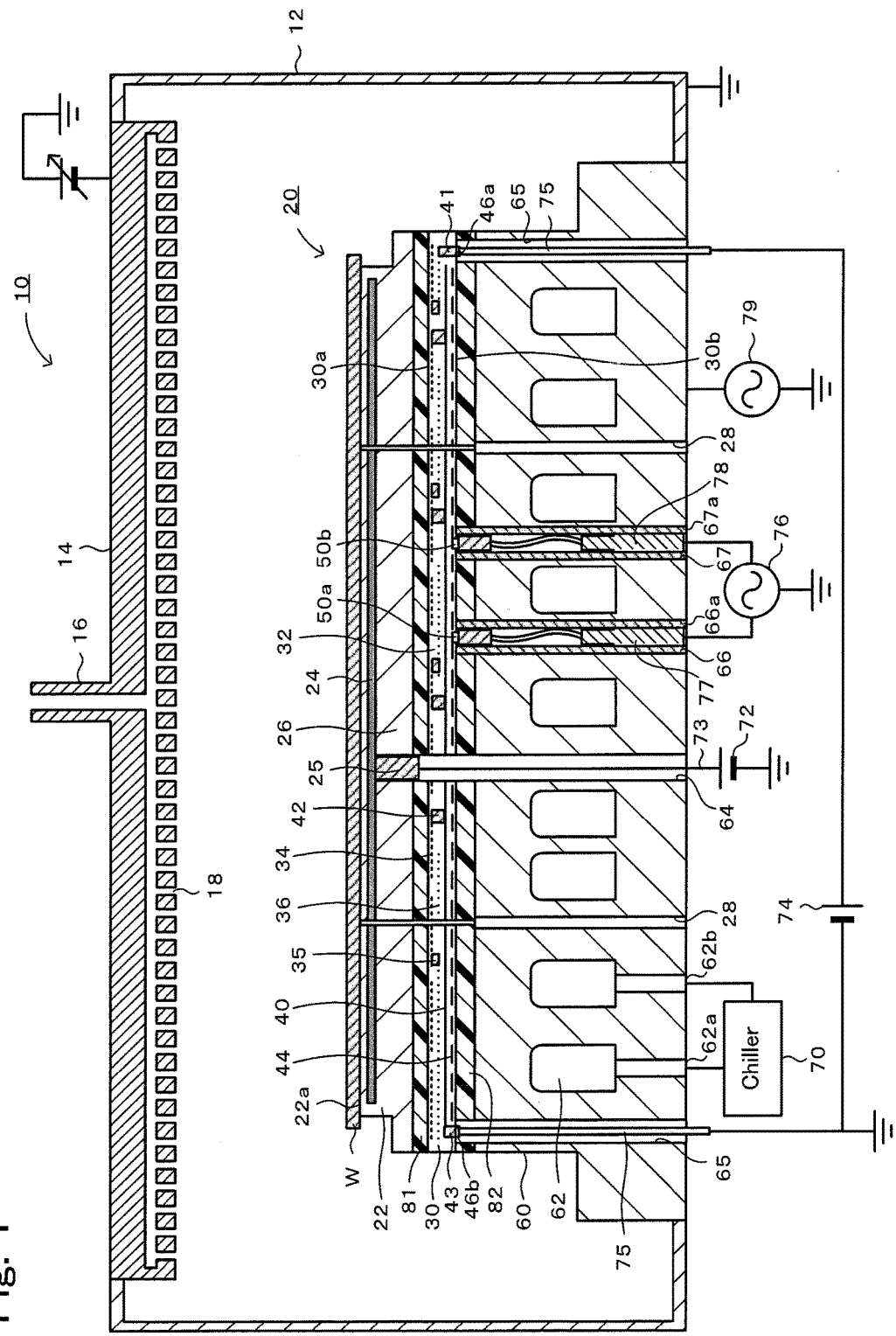
FIG. 1 is a cross-sectional view illustrating a general configuration of a plasma processing apparatus 10.
Figure 2:
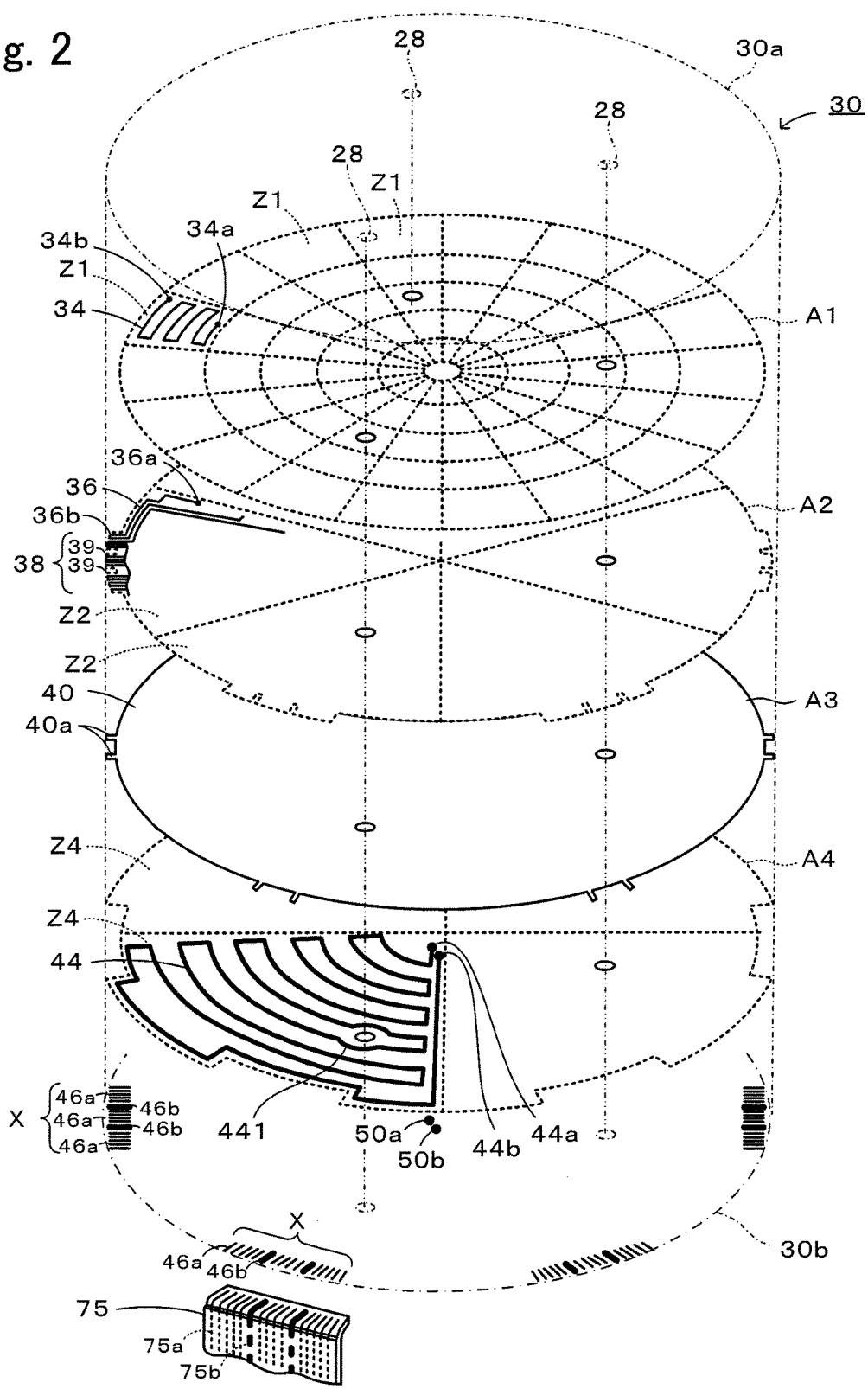
FIG. 2 is a perspective view illustrating an internal structure of a sheet heater 30.

A preferred embodiment of the present invention will be described below with reference to the drawings. FIG. 1 is a cross-sectional view illustrating a general configuration of a plasma processing apparatus 10, and FIG. 2 is a perspective view illustrating an internal structure of a sheet heater 30.

The plasma processing apparatus 10, which is a semiconductor manufacturing apparatus, includes a vacuum chamber 12, a shower head 14, and an electrostatic chuck heater 20, as illustrated in FIG. 1. The vacuum chamber 12 is a container formed to have a box shape by using an aluminum alloy or the like. The shower head 14 is provided on a ceiling surface of the vacuum chamber 12. The shower head 14 emits a process gas supplied through a gas introduction pipe 16, from a large number of gas injection holes 18, to the inside of the vacuum chamber 12. In addition, the shower head 14 plays a role of a cathode plate for generating plasma. The electrostatic chuck heater 20 is an apparatus that supports a wafer W in such a manner that the wafer W is absorbed onto a wafer placing surface 22a. Hereinafter, the electrostatic chuck heater 20 will be described in detail.

The electrostatic chuck heater 20 includes an electrostatic chuck 22, the sheet heater 30, and a support 60. A bottom surface of the electrostatic chuck 22 and a top surface 30a of the sheet heater 30 are bonded to each other with a first bonding sheet 81 interposed therebetween. A top surface of the support 60 and a bottom surface 30b of the sheet heater 30 are bonded to each other with a second bonding sheet 82 interposed therebetween. Each of the bonding sheets 81 and 82 may be a sheet including an acrylic resin layer on both surfaces of a core material made of polypropylene, a sheet including a silicone resin layer on both surfaces of a core material made of polyimide, a sheet of an epoxy resin alone, or the like. The electrostatic chuck heater 20 is provided with a plurality of (for example, three) lift-pin insertion holes 28 that are pierced through in the vertical direction. In the lift-pin insertion holes 28, lift-pins (not illustrated) that lift up the wafer are inserted from a bottom surface side of the electrostatic chuck heater 20 in a vertically movable manner.

The electrostatic chuck 22 is a disk-like member in which an electrostatic electrode 24 is embedded in a ceramic sintered body 26. Examples of the ceramic sintered body 26 include an aluminum nitride sintered body, an alumina sintered body, and the like. A top surface of the electrostatic chuck 22 is the wafer placing surface 22a on which the wafer W is placed. The thickness of the ceramic sintered body 26 is preferably, but not particularly limited to, 0.5 to 4 mm.

The sheet heater 30 is a disk-like member in which correction heater electrodes 34, jumper lines 36, a ground electrode 40, and reference heater electrodes 44 are incorporated in a heat-resistant resin sheet 32. Examples of a material of the resin sheet 32 include a polyimide resin, a liquid crystal polymer, and the like. The sheet heater 30 includes a first electrode region A1 to a fourth electrode region A4 (see FIG. 2) that are parallel to the top surface 30a of the sheet heater 30 and that have different heights. The above-described lift-pin insertion holes 28 are pierced through in the vertical direction from the top surface 30a to the bottom surface 30b of the sheet heater 30.

The first electrode region A1 is divided into a large number of zones Z1 (e.g., 100 zones or 300 zones). In each of the zones Z1, a correction heater electrode 34 is wired so as to be drawn with a single stroke entirely in the zone Z1 from an end 34a to another end 34b. In FIG. 2, a virtual line is drawn in a dotted line in the first electrode region A1, and a portion surrounded by the virtual line is referred to as a zone Z1. Although the correction heater electrode 34 is illustrated only in a single zone Z1 for convenience in FIG. 2, the same correction heater electrode 34 is provided in the other zones Z1. In a zone Z1 in which a lift-pin insertion hole 28 is disposed, the correction heater electrode 34 is wired so as to detour the lift-pin insertion hole 28. The contour of the sheet heater 30 is illustrated in a dot and dashed line.

In the second electrode region A2, the jumper lines 36 for feeding electricity to the respective plurality of correction heater electrodes 34 are provided. Thus, the number of the jumper lines 36 is equal to the number of the correction heater electrodes 34. The second electrode region A2 is divided into zones Z2 whose number is smaller than the number of the zones Z1 (e.g., 6 zones or 8 zones). In FIG. 2, a virtual line is drawn in a dotted line in the second electrode region A2, and a portion surrounded by the virtual line is referred to as a zone Z2. Although a jumper line 36 (part) is illustrated only in a single zone Z2 for convenience in FIG. 2, the same jumper line 36 is provided in the other zones Z2. In this embodiment, the description is given on the assumption that a plurality of correction heater electrodes 34 that are within a projection region when projecting one of the zones Z2 onto the first electrode region A1 belong to the same group. Ends 34a of the correction heater electrodes 34 belonging to the same group are connected to ends 36a of the jumper lines 36 in a zone Z2 corresponding to the group through via holes 35 (see FIG. 1) that are pierced through in the vertical direction between the first electrode region A1 and the second electrode region A2. Other ends 36b of the jumper lines 36 are led to an outer circumference region 38 provided in the zone Z2. As a result, the other ends 36b of the jumper lines 36 connected to the correction heater electrodes 34 belonging to the same group are collectively disposed in the single outer circumference region 38. In a region X in which the outer circumference region 38 is projected onto the bottom surface 30b of the sheet heater 30, jumper lands 46a connected to the other ends 36b of the respective jumper lines 36 through via holes 41 (see FIG. 1) are disposed side by side. In other words, the plurality of jumper lands 46a are disposed in such a manner that two or more jumper lands 46a as a group are exposed to the outside in the same region X. Note that the resistivity of the correction heater electrodes 34 is preferably higher than or equal to the resistivity of the jumper lines 36.

In the third electrode region A3, the ground electrode 40 that is common to the plurality of correction heater electrodes 34 is provided. The respective correction heater electrodes 34 are connected to the ground electrode 40 via holes 42 (see FIG. 1) from the first electrode region A1 to the third electrode region A3 through the second electrode region A2. In addition, the ground electrode 40 includes projections 40a that project from the outer circumference to the outside. The projections 40a are provided at positions facing notches 39 of each outer circumference region 38. The projections 40a are connected to ground lands 46b provided on the bottom surface 30b of the sheet heater 30 through via holes 43 (see FIG. 1). The ground lands 46b are provided together with the jumper lands 46a in the region X on the bottom surface 30b of the sheet heater 30.

The fourth electrode region A4 is divided into zones Z4 whose number is smaller than the total number of the correction heater electrodes 34 provided in the first electrode region A1 (e.g., 4 zones or 6 zones). In each of the zones Z4, a reference heater electrode 44 having a higher output than the correction heater electrodes 34 is wired so as to be drawn with a single stroke entirely in the zone Z4 from an end 44a to another end 44b. In a zone Z4 including a lift-pin insertion hole 28, the reference heater electrode 44 includes an insertion hole detour portion 44I. The insertion hole detour portion 44I is a portion in which wiring is made so as to detour the lift-pin insertion hole 28. In FIG. 2, a virtual line is drawn in a dotted line in the fourth electrode region A4, and a portion surrounded by the virtual line is referred to as a zone Z4. Although the reference heater electrode 44 is illustrated only in a single zone Z4 for convenience in FIG. 2, the same reference heater electrode 44 is provided in the other zones Z4. Both ends 44a and 44b of each reference heater electrode 44 are connected to a pair of reference lands 50a and 50b provided on the bottom surface 30b of the sheet heater 30 via holes, which are not illustrated, from the fourth electrode region A4 to the bottom surface 30b of the sheet heater 30.

The support 60 is a disk-like member formed of a metal such as Al, an Al alloy, or the like as illustrated in FIG. 1, and a refrigerant passage 62 is provided therein. An inlet 62a and an outlet 62b of the refrigerant passage 62 are connected to a chiller 70 that adjusts the temperature of a refrigerant. Being supplied from the chiller 70 into the inlet 62a of the refrigerant passage 62, the refrigerant passes through the refrigerant passage 62 provided entirely in the support 60 and is returned to the chiller 70 from the outlet 62b of the refrigerant passage 62, and is cooled in the chiller 70 to a preset temperature and is then supplied again into the inlet 62a of the refrigerant passage 62. The support 60 includes a plurality of types of through holes 64 to 67 that are pierced through the support 60 in the vertical direction. The through hole 64 is a hole for exposing a feed terminal 25 of the electrostatic electrode 24 to the outside. The through hole 65 is a hole for exposing, to the outside, a group of lands (the jumper lands 46a and the ground lands 46b, see FIG. 2) provided in the region X on the bottom surface 30b of the sheet heater 30. The through holes 66 and 67 are for exposing, respectively, the reference lands 50a and 50b of the reference heater electrode 44 to the outside. Electric insulating cylinders 66a and 67a are inserted into the through holes 66 and 67.

The plasma processing apparatus 10 further includes an electrostatic chuck power source 72, a correction heater power source 74, a reference heater power source 76, and an RF power source 79. The electrostatic chuck power source 72 is a direct-current power source and is connected to the feed terminal 25 of the electrostatic electrode 24 via a feed rod 73 inserted into the through hole 64. The correction heater power source 74 is a direct-current power source and is connected to the jumper lands 46a and the ground lands 46b of the correction heater electrodes 34 via a connection flexible printed circuit board (connection FPC) 75, which is a metal wiring set inserted into the through hole 65. Specifically, jumper lands 46a and ground lands 46b that belong to the same group illustrated in FIG. 2 are provided side by side in the same region X, and accordingly are connected via a single connection FPC 75. The connection FPC 75 is a cable obtained by bundling metal wires 75a and 75b covered with a resin coating in a band, and each of the metal wires 75a and 75b is exposed at an end facing the region X. The metal wire 75a is a leading wire for connecting the jumper lands 46a to a positive terminal of the correction heater power source 74, and the metal wire 75b is a leading wire for connecting the ground lands 46b to a negative terminal of the correction heater power source 74. The reference heater power source 76 is an alternating-current power source and is connected to one, the reference land 50a, of the reference heater electrode 44 via a cable terminal 77 inserted into the through hole 66 and is also connected to the other, the reference land 50b, of the reference heater electrode 44 via a cable terminal 78 inserted into the through hole 67. The RF power source 79 is a power source for plasma generation and is connected to supply high-frequency electric power to the support 60 that serves as an anode plate. Note that the shower head 14 that serves as a cathode plate is connected to the ground via a variable resistor.

Figure 3:
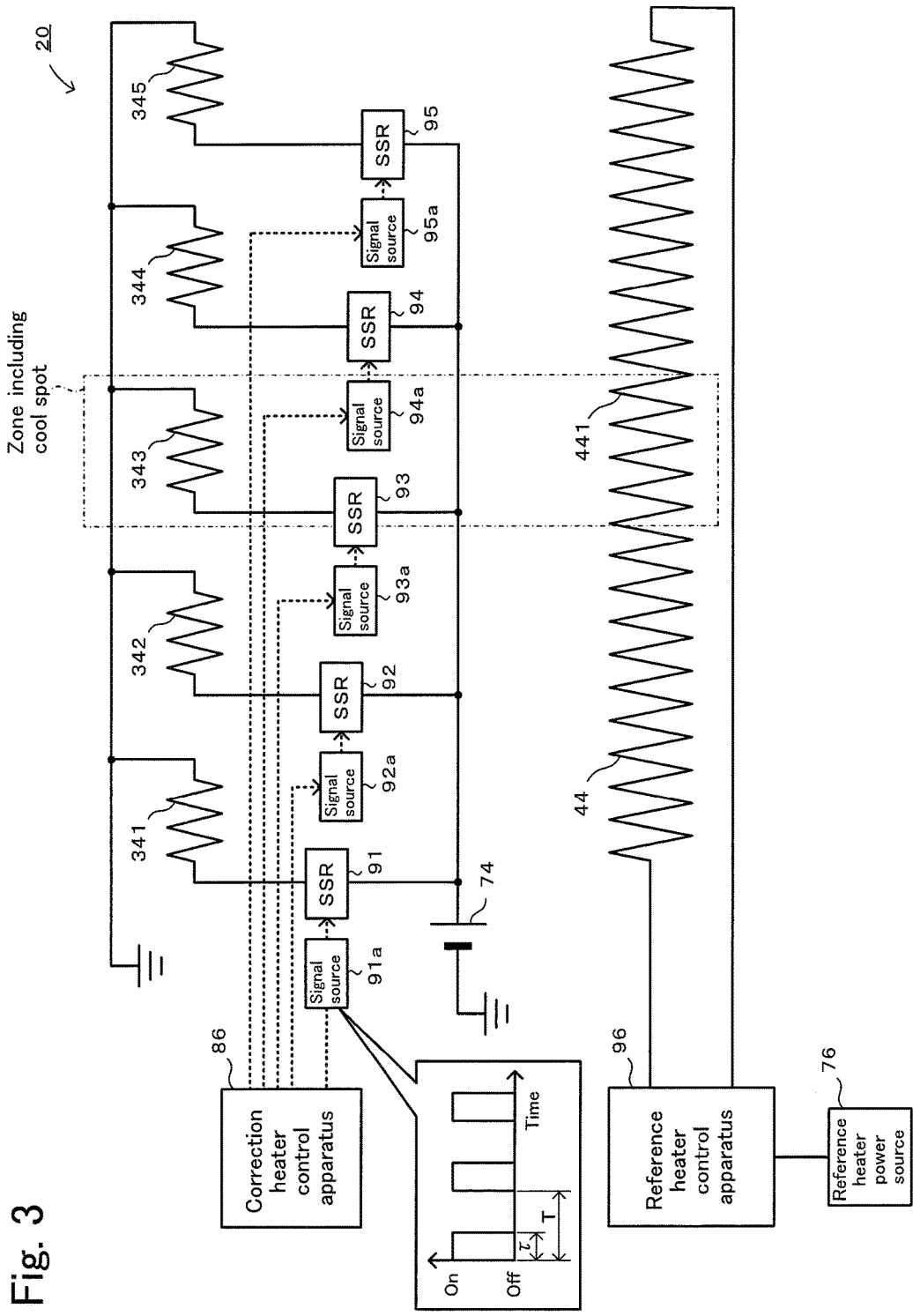
FIG. 3 is an explanation diagram illustrating electrical connection between correction heater electrodes 34 and a reference heater electrode 44.
Figure 4:
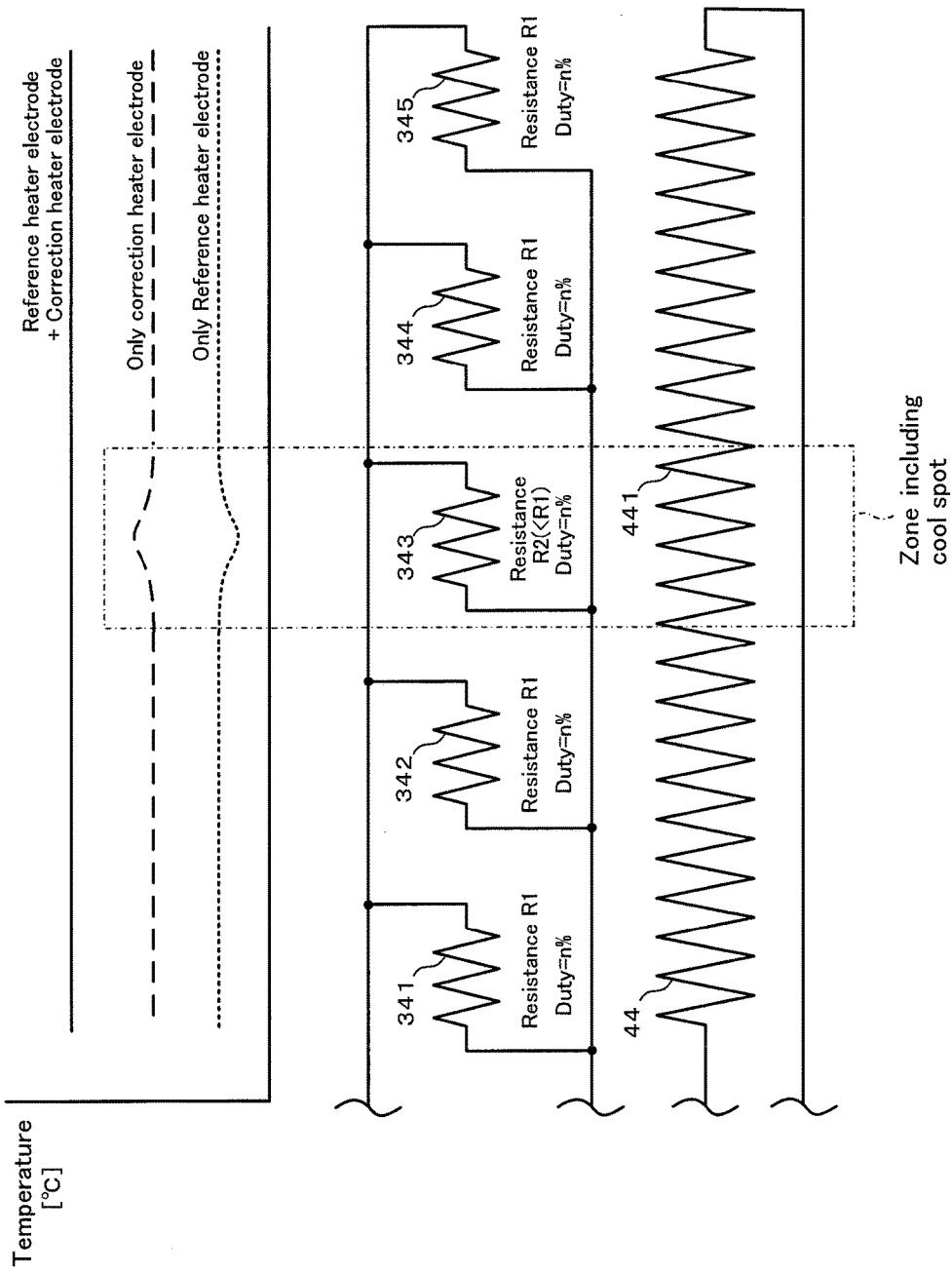
FIG. 4 is an explanation diagram illustrating a temperature profile.

Here, control of the correction heater electrode 34 wired in each zone Z1 in the sheet heater 30 and the reference heater electrode 44 wired in each zone Z4 will be described. FIG. 3 is an explanation diagram illustrating electrical connection between the correction heater electrodes 34 and the reference heater electrode 44, and FIG. 4 is an explanation diagram illustrating an example of a temperature profile. In FIG. 3 and FIG. 4, for the convenience of the description, the description will be given on the assumption that the electrostatic chuck heater 20 includes five correction heater electrodes 341 to 345 as the correction heater electrodes 34 and a single reference heater electrode 44.

The reference heater electrode 44 is connected to the reference heater power source 76, which is an alternating-current power source, via a reference heater control apparatus 96. The reference heater control apparatus 96 controls current of the reference heater power source 76, thereby adjusting the power generation amount of the reference heater electrode 44 to control the temperature of the wafer W placed on the wafer placing surface 22a. The insertion hole detour portion 44I (see FIG. 2) that detours the lift-pin insertion hole 28 in the reference heater electrode 44 has a lower wiring density than the other portions and thus tends to be a cool spot. In FIG. 3, the insertion hole detour portion 44I is, in the reference heater electrode 44, a portion surrounded by a dotted-line square region (zone including a cool spot).

The plurality of correction heater electrodes 341 to 345 are connected in parallel to the correction heater power source 74, which is a direct-current power source. On branch lines that are branched from the correction heater power source 74 into the correction heater electrodes 341 to 345, solid-state relays (SSRs) 91 to 95 corresponding to the respective correction heater electrodes 341 to 345 are disposed. The SSRs 91 to 95 are respectively connected to signal sources 91a to 95a. The signal sources 91a to 95a are connected to a correction heater control apparatus 86. The signal sources 91a to 95a output a pulse signal that is an on-off signal to a corresponding one of the SSRs 91 to 95 in accordance with a duty ratio that is input from the correction heater control apparatus 86. As illustrated in the balloon in FIG. 3, the value τ/T obtained by dividing a pulse width τ of the pulse signal by a pulse period T is the duty ratio, and an upper limit of the duty ratio is preset to a value (e.g., 1 (100%) or 0.75 (75%)) corresponding to the performance of the apparatus or the like. The duty ratio is set individually in accordance with each of the correction heater electrodes 341 to 345. The correction heater electrodes 341 to 345 are used for temperature correction performed when the temperature is not made equal owing to disturbances (singularity of structure and plasma heat input) during driving or for temperature correction for making the actual wafer temperature equal to a target temperature. Here, only a zone in which the correction heater electrode 343 is wired among the correction heater electrodes 341 to 345 is referred to as a zone in which the lift-pin insertion hole 28 is inserted, that is, a zone including a cool spot. The resistance of the correction heater electrode 343 wired in this zone is set to a value smaller than that of the other correction heater electrodes 341, 342, 344, and 345. If the same voltage is applied to the correction heater electrodes 341 to 345, since the heat generation amount is in inverse proportion to the resistance, the heat generation amount of the correction heater electrode 343 becomes the largest. Such a correction heater electrode 343, for example, has a larger width than the other correction heater electrodes 341, 342, 344, and 345 or is formed of a material having a lower resistivity than that of the other correction heater electrodes 341, 342, 344, and 345, and thereby the resistance is low.

Now, in order to make the temperature equal in the plane of the wafer W, first, plasma generating conditions are set, and a temperature distribution in the wafer W obtained when plasma is generated under these conditions is measured by infrared thermography. Then, current of the reference heater electrode 44 is set in such a manner that the temperature difference at a plurality of measurement points falls within a predetermined allowable range, and also the duty ratio of each of the correction heater electrodes 341 to 345 is set. The reference heater control apparatus 96 performs control in such a manner that the current that is set in this manner flows from the reference heater power source 76 to the reference heater electrode 44. The correction heater control apparatus 86 performs control in such a manner that the current flows from the correction heater power source 74 to each of the correction heater electrodes 341 to 345 by using the duty ratio that is set in accordance with each of the correction heater electrodes 341 to 345.

An example of the temperature distribution in the plane of the wafer W at this time is illustrated in FIG. 4. If control is performed by using only the reference heater electrode 44, as illustrated in the temperature distribution line in the dotted line in FIG. 4, the temperature decreases around the insertion hole detour portion 441. If all the duty ratios are set to n% by using only the correction heater electrodes 341 to 345, as illustrated in the temperature distribution line in the dashed line in FIG. 4, since a resistance R2 of the correction heater electrode 343 in a zone including a cool spot is lower than a resistance R1 of the other correction heater electrodes 341, 342, 344, and 345, the temperature increases around the correction heater electrode 343. In addition, if control is performed by using both the reference heater electrode 44 and the correction heater electrodes 341 to 345, as illustrated in the temperature distribution line in the solid line in FIG. 4, the temperature in the plane of the wafer W becomes constant, and the temperature is made equal in a preferable manner.

Here, if an equal voltage E is applied to each of the correction heater electrodes 341 to 345 with each duty ratio being set to 100%, a heat generation amount P1 of each of the correction heater electrodes 341, 342, 344, and 345 becomes $P1=E^2/R1$, and a heat generation amount P2 of the correction heater electrode 343 becomes $P2=E^2/R2$. Since the resistance R2 is lower than the resistance R1 (R2<R1), the heat generation amount P2 is higher than the heat generation amount P1 (P2>P1). If a setting range of the duty ratio is 0 to 100%, a setting range of the heat generation amount of the correction heater electrodes 341, 342, 344, and 345 is 0 to P1, and a setting range of the heat generation amount of the correction heater electrode 343 is 0 to P2. It is found that the latter enables adjustment of the heat generation amount in a wider range, thereby enabling temperature adjustment in a wider range.

Note that FIG. 4 illustrates a case in which all the duty ratios of the correction heater electrodes 341 to 345 are the same value (n %) as an example. However, since the duty ratios are set in such a manner that the temperatures of zones in which the respective correction heater electrodes 341 to 345 are wired become an equal temperature, all the duty ratios are not necessarily the same value and may be different values.

Here, the correspondence relationship between components in this embodiment and components in the present invention will be revealed. The electrostatic chuck 22 in this embodiment corresponds to an electrostatic chuck of the present invention, the correction heater electrodes 34 and 341 to 345 correspond to small heater electrodes, the first electrode region A1 corresponds to a small-zone formation region, the correction heater power source 74 corresponds to a power source, and the correction heater control apparatus 86 corresponds to a small-zone control apparatus. In addition, the sheet heater 30 corresponds to a heater support body, the reference heater electrodes 44 correspond to large-zone electrodes, the fourth electrode region A4 corresponds to a large-zone formation region, and the reference heater control apparatus 96 corresponds to a large-zone control apparatus.

According to the electrostatic chuck heater 20 described above, the correction heater electrode 343 in a zone including a cool spot cannot supply electric power that is over the upper limit of the duty ratio, but since the resistance is lower than that of the correction heater electrodes 341, 342, 344, and 345 in other zones, even if the duty ratio is the same, the heat generation amount is increased. Accordingly, it is possible to ensure a margin for electric power that is applicable to each small heater in a state in which the temperature of the zone including a cool spot is the same or substantially the same as the temperature of the zone not including a cool spot. Thus, it is possible to make the temperature sufficiently equal in the electrostatic chuck heater 20 of a multi-zone heater type against variable temperatures due to various disturbances.

In addition, the correction heater electrode 343 has a larger width than the other correction heater electrodes 341, 342, 344, and 345 or is formed of a material having a lower resistivity than that of the other correction heater electrodes 341, 342, 344, and 345. Even if the electrode material is the same, a large width decreases the resistance. In addition, even if the width is the same, the use of a material having a low resistivity decreases the resistance.

Furthermore, a zone in which the lift-pin insertion hole 28 is provided has been described as an example of the zone including a cool spot in the first electrode region A1.

However, the lift-pin insertion hole 28 is a portion in which wiring cannot be provided and thus tends to be a cool spot.

Moreover, in principle, the temperature of the wafer W placed on the electrostatic chuck 22 is made equal by controlling the reference heater electrode 44, and the temperature of the wafer W is made more equal by controlling the correction heater electrodes 341 to 345. Thus, the temperature can be made equal delicately.

Note that the present invention is not limited to the above-described embodiment at all. It is needless to say that the present invention can be implemented in various manners without departing from the technical scope of the present invention.

For example, in the above-described embodiment, when controlling the temperature of the wafer W, a temperature sensor may be provided right above each of the zones Z1 on the wafer placing surface 22a, and the duty ratio of each of the correction heater electrodes 34 may be controlled in such a manner that the temperature detected by each temperature sensor becomes a target temperature.

Although the above-described embodiment has described the zone including the lift-pin insertion hole 28 as an example of the zone including a cool spot, the zone including a cool spot is not particularly limited to this. For example, the zone including a cool spot may be a zone including a gas supplying hole that is pierced through the electrostatic chuck heater 20 in the vertical direction for sending a He gas to a rear surface of the wafer W. Alternatively, the zone including a cool spot may be a zone including a hole having a bottom in the vertical direction. Such a hole having a bottom may be a hole for inserting the feed rod 73 for supplying electric power to the electrostatic electrode 24 from a rear surface of the electrostatic chuck heater 20, or the like.

Although the above-described embodiment has not particularly described the resistance of the reference heater electrode 44, a heater line of the insertion hole detour portion 441 may have a high resistance and may be designed to generate a larger amount of heat than the other portions even when the same current flows. In such a manner, the temperature of the wafer W may be controlled to be equal with accuracy to some extent by using the reference heater electrode 44. Accordingly, the temperature of the wafer W can be controlled to be equal with higher accuracy by using both the reference heater electrode 44 and the correction heater electrodes 34 and 341 to 345.

In the above-described embodiment, a region for forming the correction heater electrodes 34 is provided inside the sheet heater 30 that is different from the ceramic sintered body 26 in which the electrostatic electrode 24 is embedded. However, the region for forming the correction heater electrodes 34 may be provided inside the ceramic sintered body 26. The same applies to the reference heater electrode 44.

The present application claims priority from Japanese Patent Application No. 2016-141329, filed on Jul. 19, 2016, the entire contents of which are incorporated herein by reference.

What is claimed is:

1. An electrostatic chuck heater comprising:
an electrostatic chuck in which an electrostatic electrode is embedded in a ceramic sintered body;
a small-zone formation region provided inside the ceramic sintered body or a heater support body that is integrated with the ceramic sintered body, the small-zone formation region including a plurality of small zones in which small heater electrodes are wired;
a power source to which the plurality of small heater electrodes are connected in parallel; and
a small-zone control apparatus that performs control such that desired electric power is supplied to each of the small heater electrodes by using an output ratio to a suppliable output corresponding to each of the small heater electrodes,
wherein among the plurality of small heater electrodes, a small heater electrode that is wired in a small zone including a cool spot has a resistance that is set to a smaller value than that of the other small heater electrodes.

2. The electrostatic chuck heater according to claim 1, wherein the small heater electrode that is wired in the small zone including the cool spot has a larger width than the other small heater electrodes or is formed of a material having a lower resistivity than that of the other small heater electrodes.

3. The electrostatic chuck heater according to claim 1, wherein the small zone including the cool spot is a small zone in which a through hole or a hole having a bottom in a vertical direction is provided.

4. The electrostatic chuck heater according to claim 1, further comprising:
a large-zone formation region provided inside the ceramic sintered body or the heater support body, the ceramic sintered body having a plurality of stacked layers, with the large-zone formation region positioned on one of the plurality of stacked layers that is proximate a bottom surface of the ceramic sintered body so as to be below the small-zone formation region, which is positioned on one of the plurality of stacked layers that is proximate a top surface of the ceramic sintered body, in a plan view, the large-zone formation region including large zones, whose number is smaller than the number of the small zones, in which large-zone electrodes are wired; and
a large-zone control apparatus that controls electric power supply to each of the large-zone electrodes.

5. The electrostatic chuck heater according to claim 1, further comprising:
a large-zone formation region having a large-zone electrode that is provided in the ceramic sintered body or the heater support body integrated with the ceramic sintered body, with the large-zone electrode having an insertion hole detour portion, such that the small heater electrode, among the plurality of small heater electrodes, that includes the resistance that is set to be to a smaller value than that of the other small heater electrodes is directly overlapping the insertion hole detour portion, which forms the cool spot, in a plan view.

* * * * *